United States Patent
Matsushita et al.

(10) Patent No.: US 7,501,292 B2
(45) Date of Patent: Mar. 10, 2009

(54) METHOD FOR MANAGING UV IRRADIATION FOR CURING SEMICONDUCTOR SUBSTRATE

(75) Inventors: Kiyohiro Matsushita, Tama (JP); Kenichi Kagami, Tama (JP)

(73) Assignee: ASM Japan K.K., Tokyo (JP)

( * ) Notice: Subject to any disclaimer, the term of this patent is extended or adjusted under 35 U.S.C. 154(b) by 0 days.

(21) Appl. No.: 11/780,021

(22) Filed: Jul. 19, 2007

(65) Prior Publication Data
US 2009/0023229 A1  Jan. 22, 2009

(51) Int. Cl.
*H01L 21/66* (2006.01)
(52) U.S. Cl. ........................................................ 438/16
(58) Field of Classification Search .................. None
See application file for complete search history.

(56) References Cited

U.S. PATENT DOCUMENTS

| | | | |
|---|---|---|---|
| 6,296,909 B1 | 10/2001 | Spitsberg et al. | |
| 6,420,036 B1 * | 7/2002 | Varaprasad et al. | 428/432 |
| 6,759,098 B2 | 7/2004 | Han et al. | |
| 7,070,106 B2 * | 7/2006 | Knowles et al. | 235/462.14 |
| 2003/0087107 A1 * | 5/2003 | Varaprasad et al. | 428/432 |

\* cited by examiner

*Primary Examiner*—Scott B. Geyer
*Assistant Examiner*—Andre' C Stevenson
(74) *Attorney, Agent, or Firm*—Knobbe, Martens, Olson & Bear LLP

(57) ABSTRACT

A method for managing UV irradiation for curing a semiconductor substrate, includes: passing UV light through a transmission glass window provided in a chamber for curing a semiconductor substrate placed in the chamber; monitoring an illuminance upstream of the transmission glass window and an illuminance downstream of the transmission glass window; determining a timing and/or duration of cleaning of the transmission glass window, a timing of replacing the transmission glass window, a timing of replacing a UV lamp, and/or an output of the UV light based on the monitored illuminances.

17 Claims, 6 Drawing Sheets

METHOD FOR MANAGING UV IRRADIATION FOR CURING SEMICONDUCTOR SUBSTRATE

BACKGROUND OF THE INVENTION

1. Field of the Invention

The present invention generally relates to a method for controlling UV irradiation for curing a semiconductor substrate and a method for processing a semiconductor substrate using the UV irradiation controlling method.

2. Description of the Related Art

Traditionally, UV processing apparatuses have been commonly used for the modification of various processing targets with UV light and the production of substances by means of photochemical reaction. The recent trend of higher integration of devices results in increasingly finer wiring designs and multi-layer wiring structures, which gives rises to a need to reduce the interlayer volume in order to increase the device speed while reducing the power consumptions. To reduce the interlayer volume, low-k (low dielectric constant film) materials are used. However, use of a low-k material results in lower mechanical strength (indicated by elastic modulus, or EM) as the dielectric constant decreases, which makes it difficult for the low-k material to withstand the stress received in subsequent processes such as CMP, wire bonding and packaging. One method to improve the above problem is to cure the low-k material through UV irradiation and thereby increase its mechanical strength (refer to U.S. Pat. Nos. 6,759,098 and 6,296,909 for examples of this method). When irradiated by UV light, the low-k material shrinks and hardens, resulting in a 50 to 200% increase in its mechanical strength (EM).

Highly integrated devices available in recent years are also forcing the industry to find ways to form various thin films via thermal CVD or PECVD in a condition free from damage or flaw due to heat or plasma. As an approach to address this need, photo CVD involving photochemical reaction has been studied for some time.

When the processing target or reaction space is to be irradiated with optical energy under any photo CVD method, however, the UV lamp must be separated from the reaction space because: (1) the pressure and ambient gas in the reaction space must be controlled, (2) the UV lamp will become dirty due to generated gas, and (3) generated gas must be discharged safely. An optical-transmission type window glass made of synthetic quartz, which transmits optical energy, has generally been used to constitute a partition for separating the two (although many types of glass are available, synthetic quartz has been favored because it is relatively inexpensive and has the ability to transmit various lights over a wide spectrum up to the UV range in a vacuum atmosphere).

SUMMARY OF THE INVENTION

Depending on the material of the transmission window, however, its transmissivity tends to drop when the transmitting light is UV light, which carries high energy, due to deposits accumulating on the window material. Therefore, cleaning is required in the curing process where a large amount of outgas (decomposed gas produced from the irradiated film) generates. In an embodiment of the present invention, transmissivity is monitored constantly or at specified timings to implement cleaning in appropriate cycles.

In an embodiment of the present invention, the UV irradiation apparatus is equipped with UV illuminometers that measure the illuminance of the UV light in an immediate vicinity of the UV light source and after the transmission window glass, so as to monitor illuminance constantly or at specified timings.

Since the degree of drop in transmissivity varies depending on the wavelength of the UV light to be used, in an embodiment of the present invention transmissivity is measured using UV illuminometers capable of measuring the wavelength of the applicable UV light in an effective or specific manner.

Accuracy of measurement can be assured through periodic calibration of the UV illuminometers themselves.

In an embodiment of the present invention, the illuminance of the UV light source is compared against the illuminance measured after the transmission window glass, to measure the rate of drop in illuminance caused by contamination or degradation of the transmission window glass.

In an embodiment of the present invention, a mechanism is provided whereby the lamp-based light source receives a feedback of illuminance information and increases the output to compensate for any drop in illuminance in order to maintain the illuminance at a constant level.

When the window glass is cleaned, the illuminance recovers to around the same level measured at the beginning of curing. In an embodiment of the present invention, a point where little change is observed in illuminance after cleaning is defined as the endpoint, and cleaning is terminated upon reaching the endpoint.

In an embodiment of the present invention, illuminance is monitored during curing and the cleaning time and frequency are controlled in such a way that cleaning is not performed until the monitored illuminance reaches a certain level (such as a level at which the quality of the cured film is not affected).

In an embodiment of the present invention, it is also possible to automatically control the cleaning time and frequency by using specific illuminance values as triggers.

The transmission window glass absorbs a part of UV light and sustains damage from the heat generated by the heater table, and therefore its transmissivity drops over time. As a result, the illuminance of UV light reaching the curing target drops. In an embodiment of the present invention, transmissivity is monitored to grasp the condition of damage sustained by the synthetic quartz to determine when it needs to be replaced. For example, the replacement timing can be controlled by monitoring the transmissivity drop caused by glass degradation and replacing the glass when the transmissivity drops to a specified value or lower.

For purposes of summarizing the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not to scale.

DETAILED DESCRIPTION OF THE PREFERRED EMBODIMENT

Figure 1:
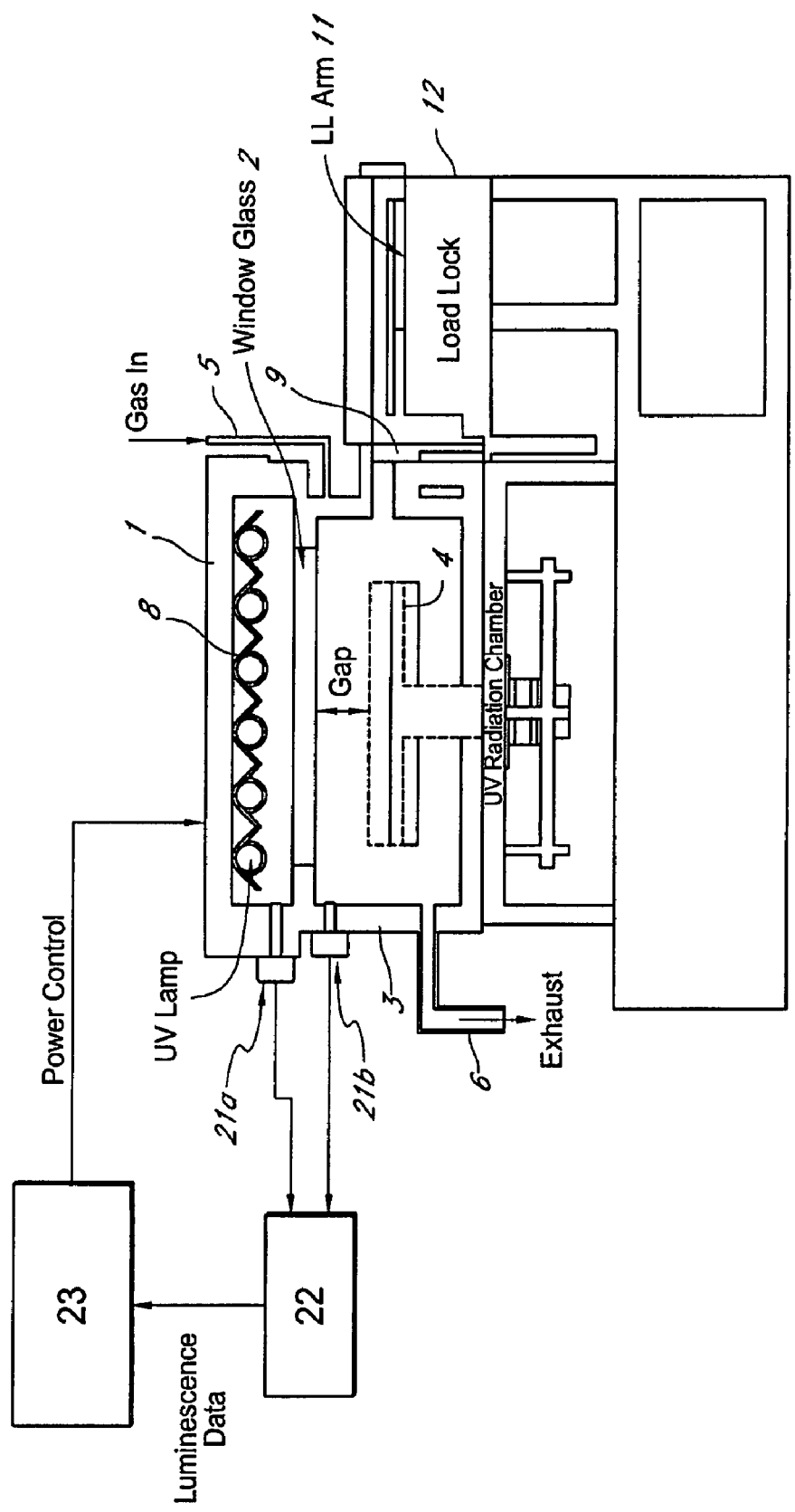
FIG. 1 is a schematic diagram of a UV irradiation apparatus usable in an embodiment of the present invention.

The present invention will be explained in detail with reference to preferred embodiments. However, the preferred embodiments are not intended to limit the present invention.

In an embodiment of the present invention, a method for managing UV irradiation for curing a semiconductor substrate, may comprise: (a) passing UV light through a transmission glass window provided in a chamber for curing a semiconductor substrate placed in the chamber; (b) monitoring an illuminance upstream of the transmission glass window and an illuminance downstream of the transmission glass window; and (c) determining a timing and/or duration of cleaning of the transmission glass window, a timing of replacing the transmission glass window, a timing of replacing a UV lamp, and/or an output of the UV light based on the monitored illuminances.

In the above, in an embodiment, the monitoring step may comprise measuring the illuminance upstream of the transmission glass window by an illuminometer provided upstream of the transmission glass window and the illuminance downstream of the transmission glass window by an illuminometer provided downstream of the transmission glass window, thereby obtaining a transmissivity of the UV light.

In any one of the foregoing embodiments, the passing UV light step and the monitoring step may be performed at least at one time selected from the group consisting of a start of curing of the semiconductor substrate, an end of curing of the semiconductor substrate, a start of cleaning of the transmission glass window, and an end of cleaning of the transmission glass window.

In any one of the foregoing embodiments, the determining step may comprise: (A) comparing the illuminance downstream of the transmission glass window with a first reference value; (B) comparing the illuminance upstream of the transmission glass window with a second reference value; (C) determining to initiate cleaning of the transmission glass window if the illuminance downstream of the transmission glass window is equal to or lower than the first reference value and the illuminance upstream of the transmission glass window is not equal to or lower than the second reference value; and (D) determining to replace the UV lamp if the illuminance upstream of the transmission glass window is equal to or lower than the second reference value.

In the above, in an embodiment, when the cleaning is initiated, the passing UV light step and the monitoring step may be repeated during the cleaning and the determining step may further comprise: (E) comparing the illuminance downstream of the transmission glass window monitored with a third reference value; and (F) determining to end cleaning of the transmission glass window if the illuminance downstream of the transmission glass window is equal to or higher than the third reference value.

In the above, in an embodiment, when the illuminance downstream of the transmission glass window is not equal to or higher than the third reference value, the determining step may further comprise: (G) comparing the illuminances consecutively monitored downstream of the transmission glass window; and (H) determining to end cleaning of the transmission glass window if a difference between the consecutively monitored illuminances downstream of the transmission glass window is equal to or less than a standard value.

In the above, in an embodiment, the determining step may further comprise: (I) determining to increase the output of the UV light to compensate for a differenced between the illuminance downstream of the transmission glass window at the end of the cleaning and the third reference value.

In the above, in an embodiment, the determining step may further comprise: (J) comparing the illuminance downstream of the transmission glass window upon the increase of the output of the UV lamp with a fourth reference value; and (K) determining to replace the transmission glass window if the illuminance downstream of the transmission glass window upon the increase of the output of the UV lamp is equal to or lower than a standard value.

In any one of the foregoing embodiments, the passing UV light step and the monitoring step may be repeated after a different semiconductor substrate is loaded in the chamber.

In any one of the foregoing embodiments, the determining step may comprise comparing the illuminances monitored downstream of the transmission glass window in the respective monitoring steps, thereby determining the timing of replacing the transmission glass window.

In any one of the foregoing embodiments, the determining step may comprise comparing the illuminances monitored in the respective monitoring steps, thereby determining the timing of cleaning the transmission glass window.

In any one of the foregoing embodiments, the passing UV light step and the monitoring step may be performed frequently or continuously during cleaning, thereby determining an endpoint of the cleaning.

In any one of the foregoing embodiments, the determining step may comprise determining the output of the UV light, and the method may further comprise increasing the output of the UV light based on the determined output of the UV light determined to maintain the illuminance of the UV light passing through the transmission glass window.

In any one of the foregoing embodiments, the determining step may comprise determining the timing of cleaning by setting a threshold value of illuminance to initiate cleaning and comparing the monitored illuminance downstream of the transmission glass window with the threshold value of transmissivity.

In any one of the foregoing embodiments, the determining step may comprise determining the timing of replacing the transmission glass window by setting a threshold value of illuminance to replace the transmission glass window and comparing the monitored illuminance downstream of the transmission glass window with the threshold value of illuminance.

In any one of the foregoing embodiments, the UV light may have a wavelength of 170 nm to 300 nm.

In another embodiment of the present invention, a method for curing a semiconductor substrate by UV light, may comprise: (i) curing a semiconductor substrate placed in a chamber by passing UV light through a transmission glass window provided in the chamber; (ii) cleaning the transmission glass window; (iii) performing any one of the foregoing methods, thereby determining a timing and/or duration of cleaning of the transmission glass window, a timing of replacing the transmission glass window, a timing of replacing a UV lamp, and/or an output of the UV light based on the monitored transmissivity; and (iv) according to step (iii), controlling the timing and/or duration of step (ii), replacing the transmission glass window, replacing the UV lamp, and/or increasing the output of the UV light in step (i).

In the present disclosure, "illuminance" can be rephrased as absorbance or intensity, or in some cases, as transmissivity. Further, in the present disclosure where conditions and/or structures are not specified, the skilled artisan in the art can readily provide such conditions and/or structures, in view of the present disclosure, as a matter of routine experimentation. Also, in the present disclosure, the numerical numbers applied in embodiments can be modified by ±50% in other embodiments, and the ranges applied in embodiments may include or exclude the endpoints.

The present invention will be explained in detail with reference to drawings and examples. However, the drawings and the examples are not intended to limit the present invention.

The best mode for carrying out the present invention is explained below by referring to FIGS. 1 and 2.

As shown in FIG. 1, the UV irradiation apparatus used under the present invention comprises a UV unit 1 equipped with a UV lamp 7; an irradiation window 2; a reactor body 3; a gas inlet ring (not illustrated) provided in the interior wall of the reactor body and connected to a gas introduction pipe 5; a heater table 4; a vacuum pump (not illustrated) connected to an exhaust port 6; and a pressure control valve (not illustrated) installed inside the exhaust port. The apparatus shown in FIG. 1 is connected to a load lock chamber 12, and a loading/unloading robot 11 inside the load lock chamber is used to load/unload a substrate. Take note that the apparatus is not at all limited to this figure and any apparatus can be used as long as it is capable of irradiating UV light.

For example, the UV irradiation apparatuses disclosed in U.S. patent application Ser. No. 11/690,624 (filed Mar. 22, 2007) and Ser. No. 11/684,524 (filed Mar. 9, 2007), both of which are owned commonly by the assignee of the present application, can be used in embodiments of the present invention. The disclosure of the above applications is herein incorporated by reference in their entirety.

The apparatus in FIG. 1 is explained in further details. The reactor body 3 is designed to permit control of its internal pressure over a range from vacuum to near atmospheric pressure, and has the UV irradiation unit 1 placed on top.

There are UV lamps 7 capable of emitting UV light continuously and in pulses and the heater 4 is installed in a manner facing and in parallel with the UV lamps, while the irradiation window glass 2 is installed between the UV lamps and heater in a manner facing and in parallel with the UV lamps and heater. The irradiation window 2 is used to achieve uniform UV irradiation, and any material can be used, such as synthetic quartz, as long as the material is able to isolate the reactor from the atmosphere while transmitting UV light. In an embodiment, multiple tubular UV lamps 7 are placed in parallel inside the UV irradiation unit. As shown in FIG. 1, these lamps are arranged optimally to achieve uniform illuminance, while a reflection plate 8 is provided to guide the UV light emitted by each UV lamp to be properly reflected onto the thin film, and this reflection plate is designed so that its angle can be adjusted to achieve uniform illuminance. This apparatus isolates, by means of a flange (not illustrated) in which the irradiation window glass 2 is provided, the chamber whose internal pressure can be controlled over a range from vacuum to near atmospheric pressure (substrate processing part) and the UV lamps installed in the aforementioned chamber to emit UV light continuously or in pulses (UV emitting part). The structure of the UV lamps allows them to be easily removed and replaced. Gas is introduced through the flange and multiple gas inlets are provided in a symmetrical arrangement designed to achieve a uniform processing atmosphere.

The specific UV irradiation process is as follows: create an atmosphere in the chamber with a pressure of approx. 0.1 Torr to near atmospheric pressure (including 1 Torr, 10 Torr, 50 Torr, 100 Torr, 1,000 Torr and any values between the foregoing numbers) using a gas selected from Ar, CO, $CO_2$, $C_2H_4$, $CH_4$, $H_2$, He, Kr, Ne, $N_2$, $O_2$, Xe, alcohol gases and organic gases; place a semiconductor substrate, being the processing target, onto the heater that has been set to a temperature of approx. 0 to approx. 650° C. (including 10° C., 50° C., 100° C., 200° C., 300° C., 400° C., 500° C., 600° C. and any values between the foregoing numbers, but preferably 300° C. to 450° C.), by loading the substrate from the substrate transfer port through a gate valve 9; and irradiate UV light onto the thin film formed on the semiconductor substrate by maintaining an appropriate distance (1 cm to 100 cm) from the UV lamps and emitting UV light with a wavelength of approx. 100 nm to approx. 400 nm (including 150 nm, 200 nm, 250 nm, 300 nm, 350 nm and any values between the foregoing numbers, but preferably approx. 200 nm) at an output of approx. 1 $mW/cm^2$ to approx 1,000 $mW/cm^2$ (including 10 $mW/cm^2$, 50 $mW/cm^2$, 100 $mW/cm^2$, 200 $mW/cm^2$, 500 $mW/cm^2$, 800 $mW/cm^2$ and any values between the foregoing numbers) and frequency of approx. 1 Hz to approx. 1,000 Hz (including 10 Hz, 100 Hz, 200 Hz, 500 Hz and any values between the foregoing numbers) either continuously or in pulses. The irradiation time is approx. 1 sec to approx. 60 min (including 5 sec, 10 sec, 20 sec, 50 sec, 100 sec, 200 sec, 500 sec, 1,000 sec, 2,000 sec and any values between the foregoing numbers). The chamber is evacuated from the exhaust port.

In an embodiment, this semiconductor manufacturing apparatus performs a series of processing steps as described above through an automatic sequence, where the processing steps include introduction of gas, irradiation of UV light, stopping of irradiation, and stopping of gas. The intensity (illuminance) of UV light can be changed over a range of 1 to 100% and is controlled according to the applicable recipe.

The apparatus shown in FIG. 1 also has a mechanism to adjust the power input to the lamp to allow for stable operation of the UV apparatus by maintaining the illuminance of UV light at a constant level, where, to be specific, the power input is increased to compensate for any drop in the illuminance below the transmission window glass that can be caused by lamp or glass degradation. This apparatus has an illuminance measuring capability as the apparatus is equipped, in its interior wall, with UV illuminometers 21a, 21b for measuring illuminance before and after the transmission window glass. The illuminometer 21a provided above the transmission window glass 2 monitors the illuminance of the lamp directly to detect degradation of the lamp. The other illuminometer 21b measures the illuminance below the transmission window glass to allow for calculation of the difference from the value measured by the upper illuminometer, the result of which is used to determine the amount of drop in transmissivity caused by glass degradation. The UV illuminometers feed back the measured data to a power control system 23 of the UV apparatus through an illuminance monitor unit 22, to help maintain at a constant level the illuminance below the transmission window glass where the curing target is located.

If outgas generates from the thin film on the semiconductor substrate as a result of UV irradiation, it deposits on the irradiation window glass made of synthetic quartz or the like, as well as on the interior walls of the chamber. Contamination deposited on the irradiation window absorbs UV light and causes the curing efficiency to drop. FIG. 2 shows an example of changes in UV transmissivity of the irradiation window glass before and after curing. The curing conditions used by the apparatus shown in FIG. 1 are as follows:

Substrate
Thin film on substrate: SiOC
Film thickness: 100 to 1,000 nm
Means for forming film: Plasma CVD
Curing conditions
UV lamp: 0.1 to 30 kW
Transmission window material: Synthetic quartz glass
Transmission window glass thickness: 20 mm
Distance between substrate and transmission window glass: 1 to 10 cm
Distance between UV lamp and transmission window glass: 1 to 50 cm
Atmosphere in reactor body: $N_2$
Pressure: 1 to 760 Torr
Curing temperature: 200 to 600° C.
Curing time: 30 to 1,000 sec
UV illuminometer: C7460 manufactured by Hamamatsu Photonics K.K.

Figure 2:
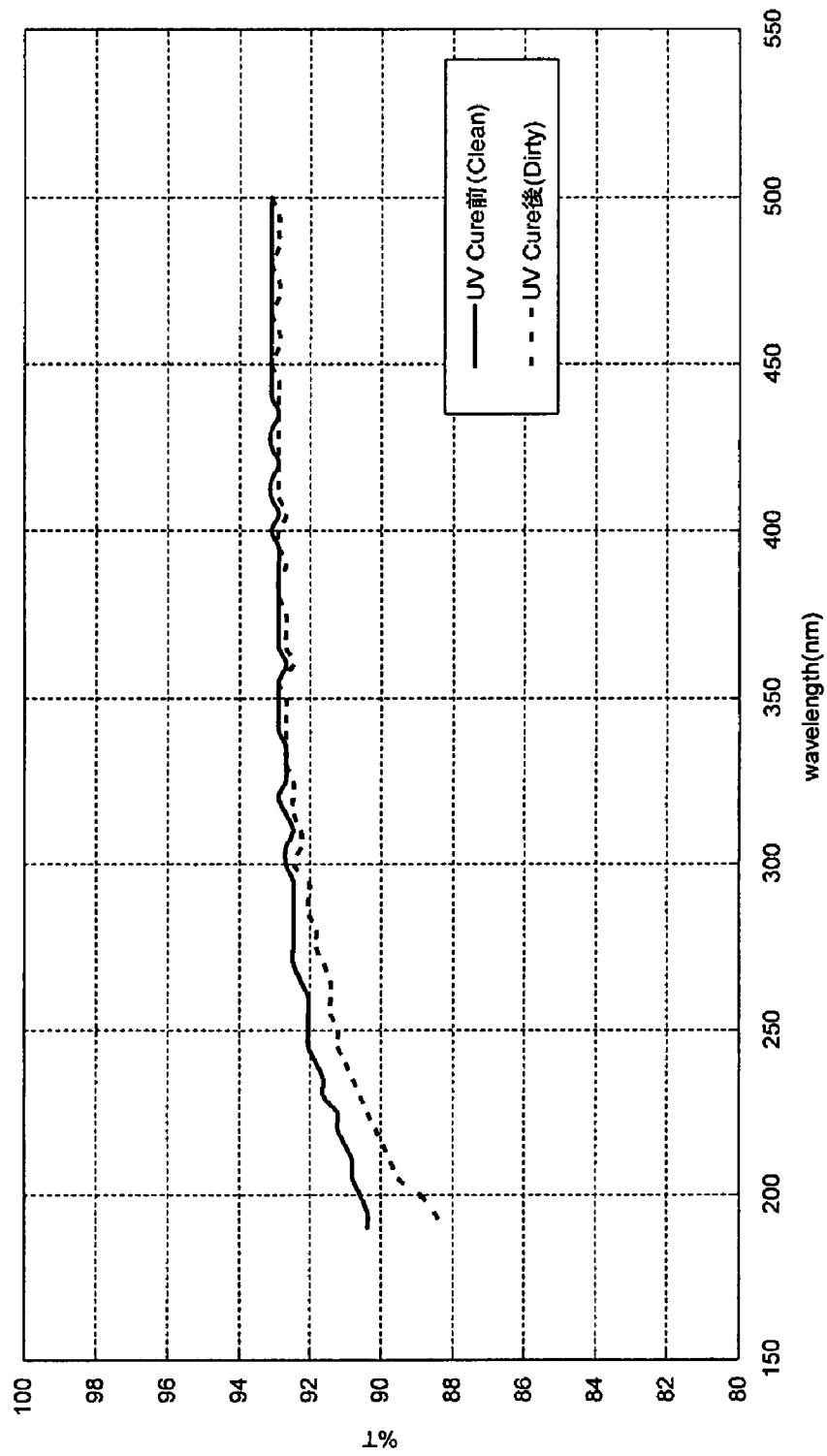
FIG. 2 is a graph showing the relationship between transmissivity of a UV transmission glass window and wavelength of UV light passing through the transmission glass before and after curing according to an embodiment of the present invention.
Figure 5:
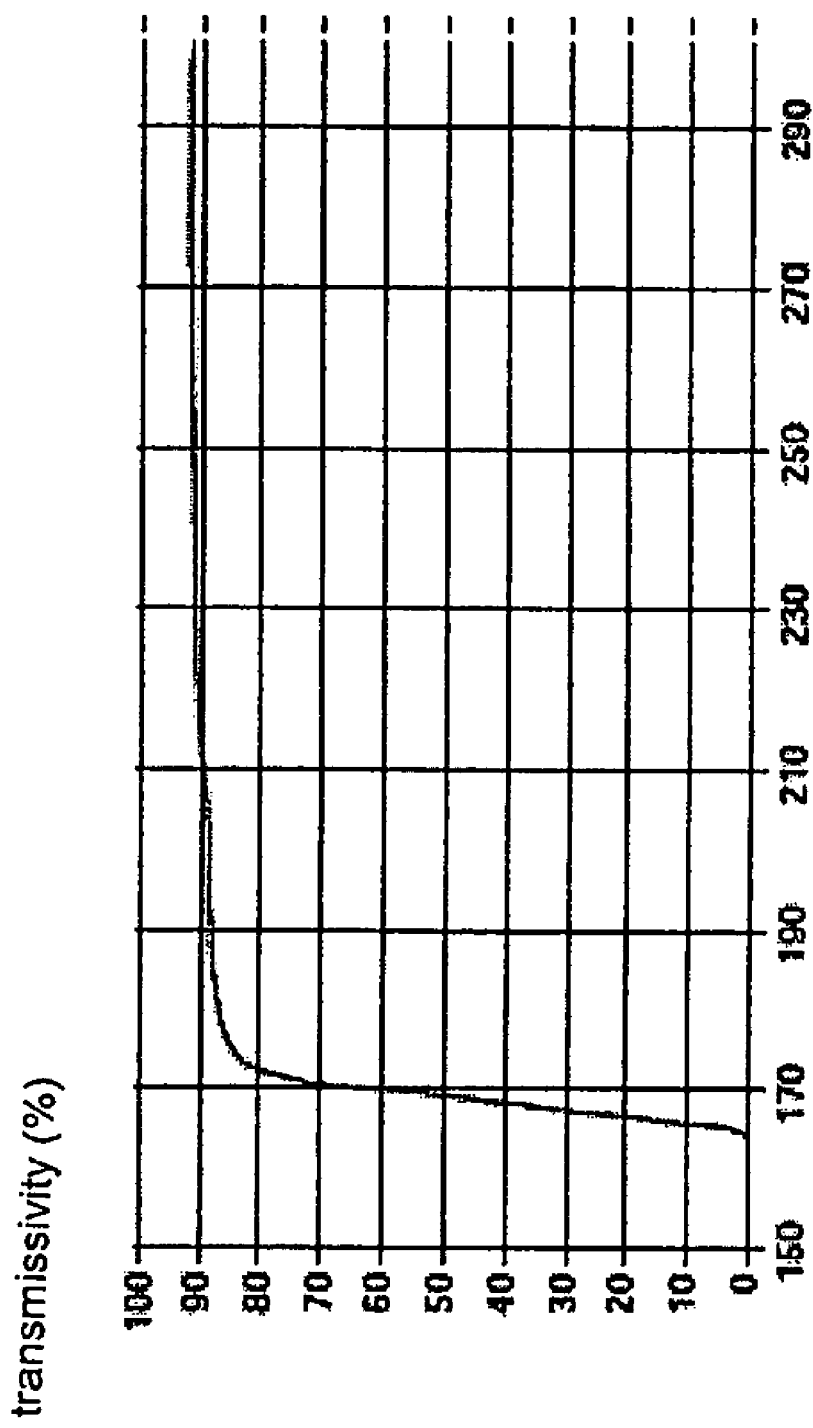
FIG. 5 is a graph showing the relationship between transmissivity of a synthetic quart glass and wavelength of UV light passing through the quart glass according to an embodiment of the present invention.

The vertical axis in FIG. 2 indicates transmissivity, or specifically the illuminance in percentage as measured by the illuminometer provided after the transmission window, where 100% represents the illuminance measured by the illuminometer provided before the transmission window. As shown in FIG. 2, before UV curing the UV transmissivity of the transmission window glass varied depending on the wavelength, and the UV transmissivity of the transmission window glass itself began to drop once the wavelength dropped to 300 nm or less. However, the transmissivity dropped more after curing, and marked drops were noted at wavelengths of 300 nm or less. In particular, the transmissivity dropped notably at wavelengths of 250 nm or less, and more notably at wavelengths of 200 nm or less. These drops were caused by an increase in outgas generation that contaminated the surface of the transmission window glass, where contamination absorbed light with wavelengths of 300 nm or less by demonstrating this tendency prominently against light with wavelengths of 250 nm or less and more prominently against light with wavelengths of 200 nm or less. These results suggest that more thorough cleaning is needed as the wavelength of light decreases in a UV system that uses light of short wavelengths of 300 nm or less. FIG. 5 shows the UV transmissivity of the transmission window glass when UV light was irradiated under the same conditions applicable to FIG. 2. According to the graph, the transmissivity is approx. 60% at 170 nm. When the transmission efficiency is also taken into consideration, therefore, the wavelength of the UV light may be 170 nm or more and 300 nm or less, preferably 250 nm or less, more preferably 200 nm or less.

Also, an example is considered where a transmissivity is set at which to start cleaning, and a program is written in such a way that post-curing transmissivity is monitored and cleaning is performed if the specified transmissivity has been reached. If the transmissivity to start cleaning is set to 89%, for instance, cleaning will be performed after every curing cycle if light of 200 nm in wavelength is used, while the cleaning frequency will drop to once after several curing cycles if light with a wavelength of 250 nm or more is used. Note, however, that the trend shown in FIG. 2 may not be strictly followed if an optimal curing time varies depending on the wavelength. As described above, when to start cleaning can be determined solely based upon the transmissivity after curing. However, it is also possible to calculate the difference between the transmissivity before curing and that after curing and use the difference as a trigger for cleaning. By using the difference in transmissivity as a trigger, the variance in transmissivity caused by the wavelength of the transmission window glass itself can be accounted for, which permits more accurate determination of cleaning timings.

Degradation of the UV lamp can also be determined by defining as 100% the initial illuminance measured by the illuminometer before the transmission window, and continuously monitoring the illuminance measured by the illuminometer before the transmission window with respect to the initial value.

Cleaning is performed to remove contamination from the transmission window glass. One example is to use $O_2$ as a cleaning gas and ozonize it in the presence of UV light to remove the contamination substance through ozone reaction. The following conditions may be used in this type of cleaning in an embodiment of the present invention:

Cleaning gas: $O_2$ (0.5 to 5 slm)
Pressure: 5 to 760 Torr
Heater table temperature: 200 to 400° C.
Reactor side wall: 100 to 180° C.
Time: 15 to 1,000 sec
UV light: Same UV light for curing is used
Frequency: Once after 1 to several curing cycles (such as once every 2 to 5 cycles)

Contamination deposited on the interior walls of the chamber will eventually separate from the walls and become particles. Such contamination can also be removed through the aforementioned cleaning.

Figure 3:
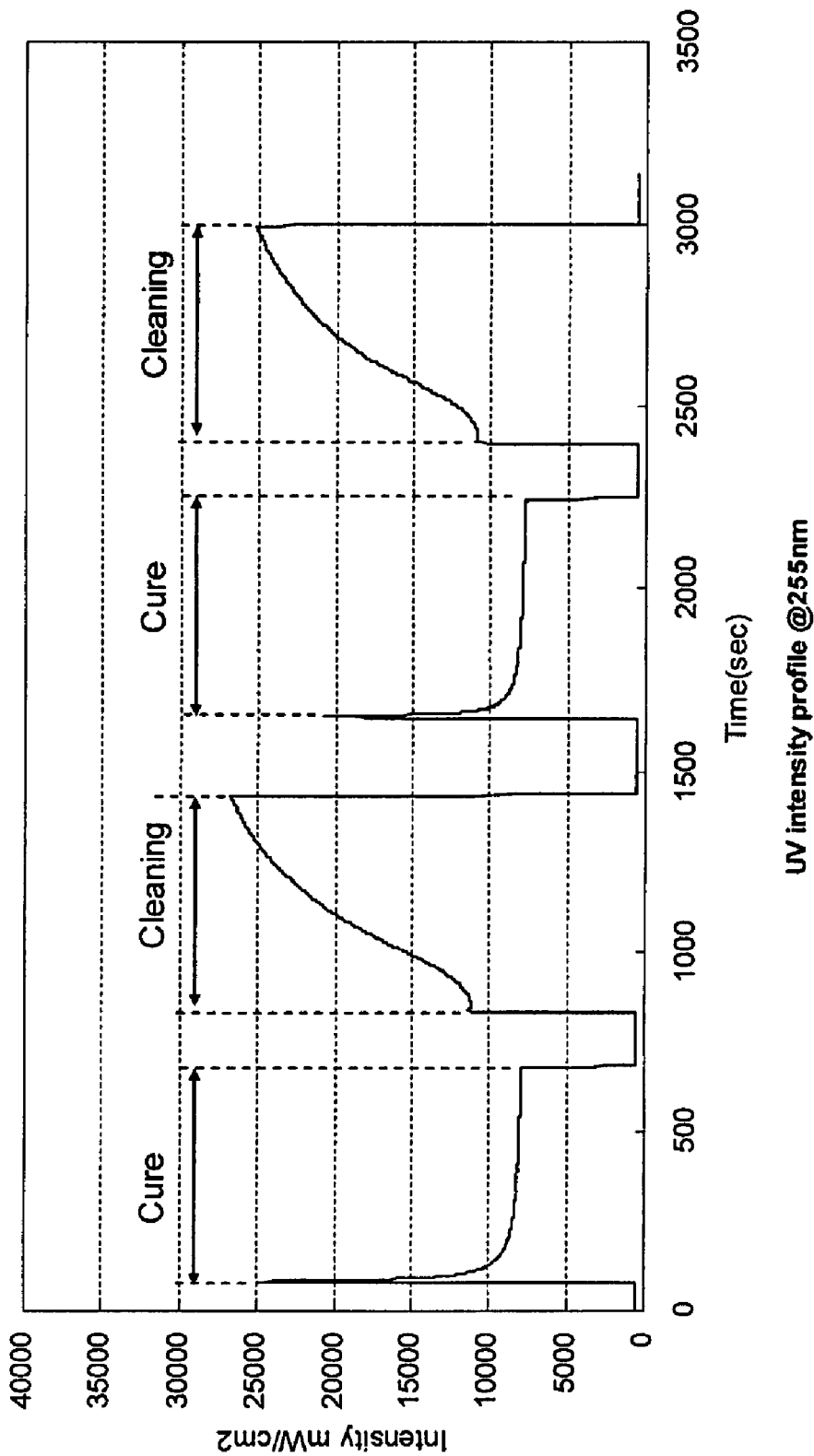
FIG. 3 is a graph showing changes in intensity of UV light (254 nm) measured under a transmission glass window after curing and cleaning according to an embodiment of the present invention.

To determine if sufficient cleaning has been carried out, the illuminance of the UV light transmitting the transmission window glass is measured to check if the illuminance has recovered to the level measured before curing. FIG. 3 shows the illuminance measured by the illuminometer after the transmission window when curing and cleaning cycles were implemented under the same curing conditions applicable to FIG. 2 as well as the following cleaning conditions:

Cleaning gas: $O_2$ (0.5 to 5 slm)
Pressure: 5 to 760 Torr
Heater table temperature: 200 to 400° C.
Reactor side wall: 100 to 180° C.
Time: 15 to 1,000 sec
UV light: Same UV light for curing is used (255 nm)

As shown by FIG. 3, through cleaning the transmissivity of the transmission window glass recovered roughly to the level before curing. In FIG. 3, the illuminance at the start of cleaning is higher than the illuminance at the end of curing. This is because UV light was absorbed by the gas generated from the film during the course of curing, which pushed the apparent illuminance lower at the end of curing. As a result, the illuminance at the start of cleaning became higher. On the other hand, the reason for the illuminance at the end of cleaning becoming higher than the illuminance at the start of curing is that because the wafer covered with a film had already been heated in the step before UV irradiation and therefore gas had been released to some extent prior to curing. The released gas caused the apparent illuminance to drop. The above changes in apparent illuminance have no direct connection with the degree of contamination on the transmission window glass. The graph shows that the illuminance after the second cleaning cycle is lower than the illuminance after the first cleaning cycle. In situations where the above is the case, the illuminance after the transmission window can be maintained at a constant level by outputting based on the monitored illuminances a signal that instructs the UV controller to raise the intensity of UV light. Another possible method is to change the point at which to end cleaning to increase the cleaning time.

If the illuminance does not recover to a sufficient level after cleaning, however, degradation of the transmission window glass is one possibility. If the aforementioned measures do not work, replacement of the transmission window glass should be examined. Specifically, the UV irradiation apparatus has a mechanism to change the power input to the lamp, which means that the illuminance on the curing target can be kept at a constant level by raising the output of the lamp by an amount corresponding to the drop in illuminance. For example, assume that the illuminance on the irradiation target dropped due to degradation of the lamp or glass when the lamp was operated at 80% its maximum power output. In this case, the power input to the lamp can be raised up to the maximum output to adjust the illuminance. However, the lamp or transmission window glass (or both) must be replaced when the drop in illuminance became so substantial that inputting the power corresponding to the full output capacity can no longer achieve the desired illuminance. In general, synthetic glass is known to absorb UV light to some extent and degrade as a result. This is probably because the absorbed light destroys the crystal structure of glass. For your reference, a combined use of the illuminometers before and after the transmission window is an effective way to determine whether it is the lamp or transmission window glass that has degraded (although it is possible, for the sake of convenience, to detect degradation using only the illuminometer after the transmission window). The illuminometer above the transmission window glass directly monitors the lamp to detect its degradation, while the illuminometer below the transmission window glass is used to measure the illuminance below the transmission window glass to allow for monitoring of the difference from the measurement taken by the upper illuminometer to indicate the amount of drop in transmissivity caused by degradation of the transmission window glass. Furthermore, a mechanism can be provided that allows the UV illuminometers to feed back the measured data to the power control system of the UV apparatus to help maintain at a constant level the illuminance below the transmission window glass where the curing target is located.

Figure 4:
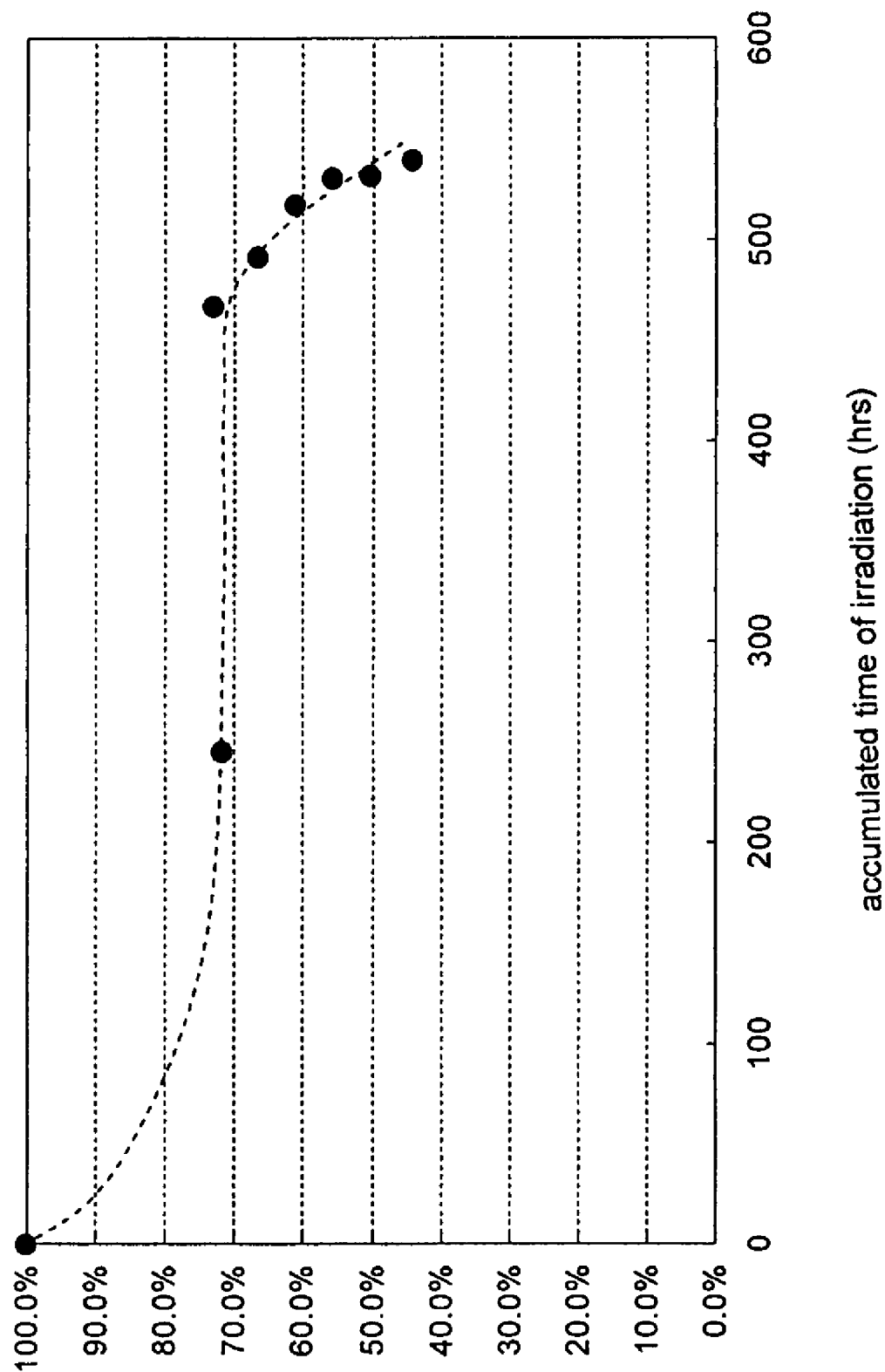
FIG. 4 is a graph showing changes in transmissivity of a UV transmission glass using UV light having a wavelength of 172 nm over time (as measured when the initial transmissivity is 100%) according to an embodiment of the present invention.

As described above, the transmission window glass is damaged by high-energy UV light and also by the heat generated from the heater table, and consequently its transmissivity drops gradually over time. FIG. 4 shows an example of changes in transmissivity of the transmission window glass over time when UV light (172 nm) was irradiated under the following conditions:
  Irradiation Conditions
  UV lamp: 1.5 kW, 172 nm
  Transmission window material: Synthetic quartz glass
  Transmission window glass thickness: 20 mm
  Atmosphere in reactor body: $N_2$
  Pressure: 5 Torr Pa
  Temperature: 400° C.

In FIG. 4, the transmissivity remains roughly flat after approx. 150 hours until 450 hours or so, but drops suddenly thereafter. In this case, an appropriate timing to replace the transmission window glass is when around 450 hours have elapsed.

For your reference, although illuminance is monitored constantly in an embodiment, it can also be monitored at specified timings instead of monitoring all the time. For example, the illuminance at the start of curing or end of cleaning can be monitored to determine if the measured value is normal.

Another point to note is that, just like contamination and degradation of the transmission window glass do, contamination and degradation of the probes of UV illuminometers can also cause drop in illuminance. However, glass contamination and probe degradation can be differentiated by calibrating the probes periodically using a standard probe. Contamination of the UV illuminometer probes can also be cleaned in the same method applicable to the cleaning of the window glass. These probes are typically made of synthetic glass. In an embodiment, the probes are separated from the reactor by a window glass made of synthetic quartz, and therefore the glass can be cleaned in the same way the transmission window glass is cleaned.

UV illuminometers include those that selectively measure specific wavelengths and those similar to spectrophotometers that measure a profile over a range of wavelengths. It is desirable that the measurement wavelengths of UV illuminometers match the wavelength of the UV light used. Various illuminometers can be selected according to the applicable UV light. For example, sensors that selectively measure light of around 172 nm, 254 nm or 365 nm in wavelength can be used to measure illuminance. It is also possible to measure a spectral profile over a range of 200 to 1,000 nm using a spectrophotometer to determine the degree of degradation from the change in the profile. When a Xe excimer UV lamp ($\lambda$=172 nm) is used, for example, illuminance can be measured using a 172-nm illuminometer. If a high-pressure mercury lamp ($\lambda$=200 to 400 nm) is used, on the other hand, use of a 254-nm illuminometer is sufficient.

As explained above, in an embodiment the UV irradiation apparatus is equipped with a sensor that directly measures the illuminance of the UV light source, and another sensor that measures the illuminance of the UV light that has transmitted the transmission window glass. By constantly monitoring the data from these sensors, the rate of drop in illuminance caused by contamination or degradation of the transmission window glass can be measured by comparing the illuminance of the light source against the illuminance after the transmission window glass. In an embodiment, illuminance information is fed back to the lamp-based light source to have the output raised to compensate for any drop in illuminance and thereby maintain the illuminance at a constant level. In an embodiment, an endpoint of cleaning is specified based on illuminance information to allow for control of cleaning time and frequency. In an embodiment, the replacement timing of the transmission window glass can be controlled by monitoring the drop in glass transmissivity caused by degradation and replacing the glass when the transmissivity has dropped to a specified level or below. In light of the above, in an embodiment the UV irradiation apparatus can be operated in a stable manner.

Figure 6:
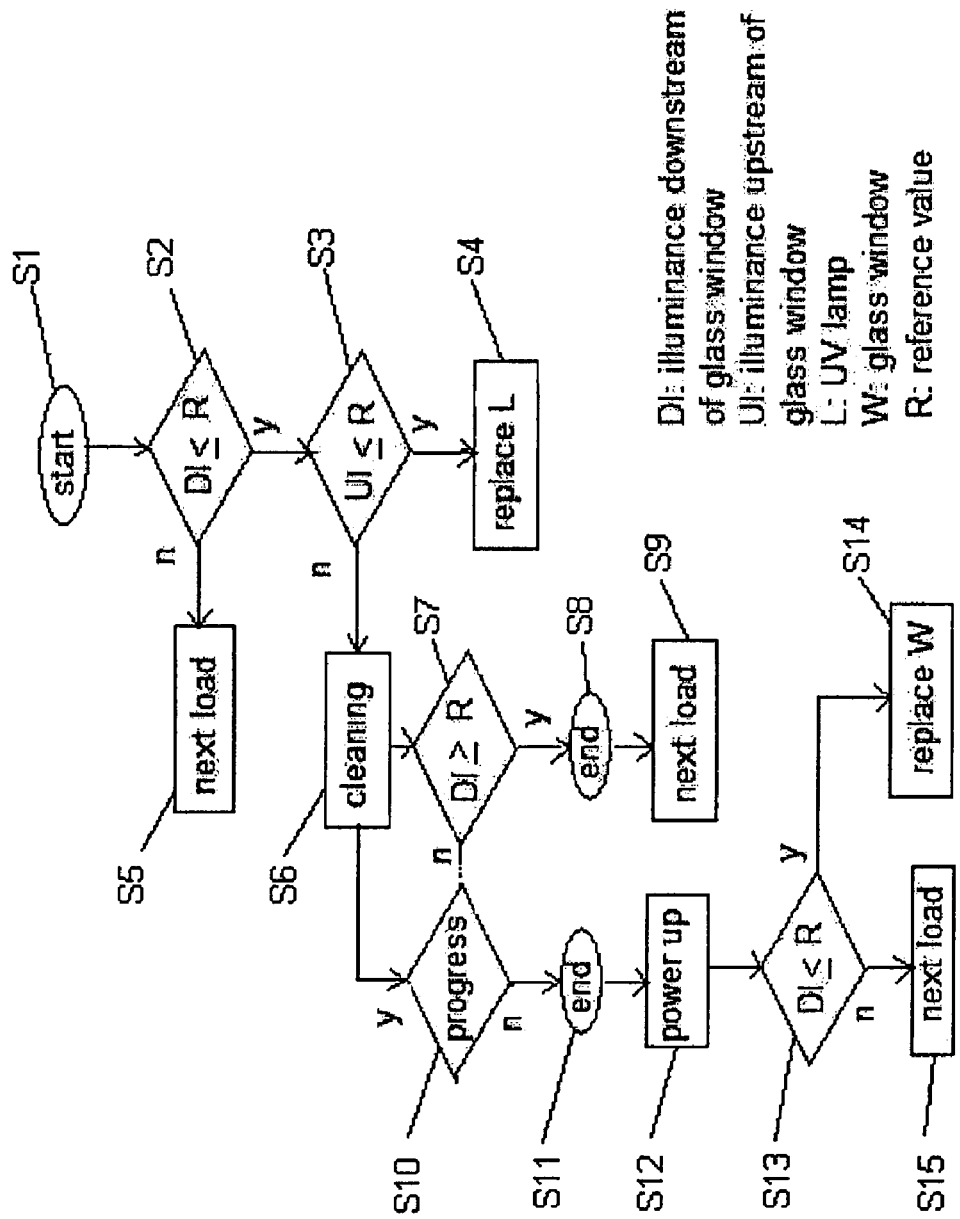
FIG. 6 is a flow chart of management of UV irradiation according to an embodiment of the present invention.
Figure 4:
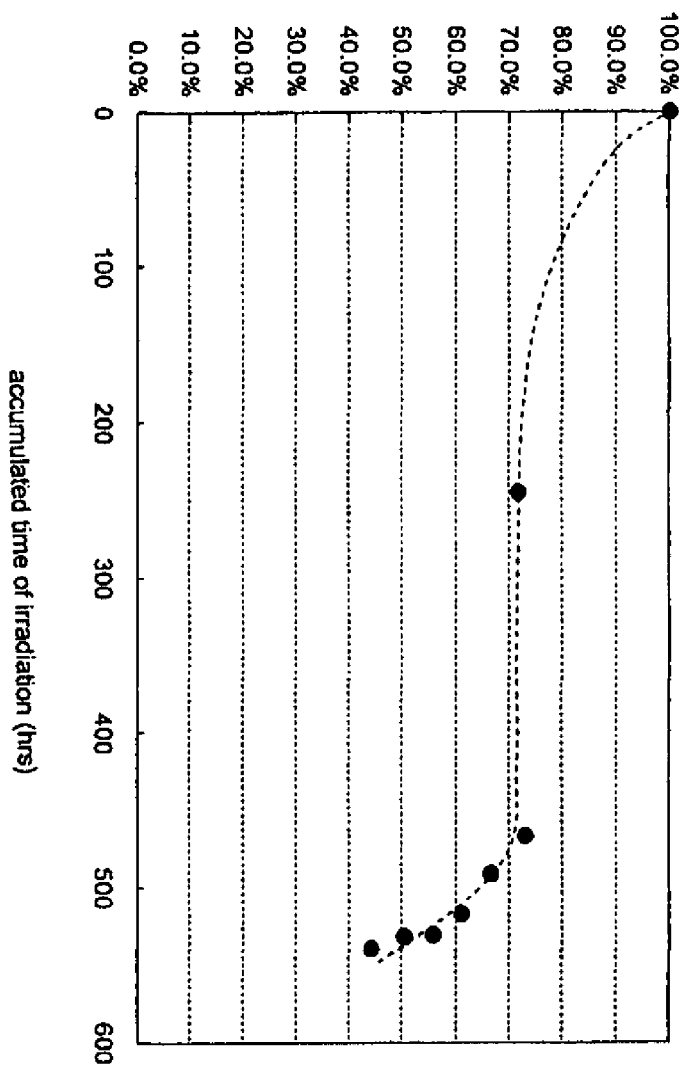

FIG. 6 is a flow chart of management of UV irradiation according to an embodiment of the present invention. The management method generally comprises: (a) passing UV light through a transmission glass window provided in a chamber for curing a semiconductor substrate placed in the chamber; (b) monitoring an illuminance upstream of the transmission glass window and an illuminance downstream of the transmission glass window; and (c) determining a timing and/or duration of cleaning of the transmission glass window, a timing of replacing the transmission glass window, a timing of replacing a UV lamp, and/or an output of the UV light based on the monitored illuminances. In the above, the passing UV light step and the monitoring step may be performed at least at one time selected from the group consisting of a start of curing of the semiconductor substrate, an end of curing of the semiconductor substrate, a start of cleaning of the transmission glass window, and an end of cleaning of the transmission glass window, or may be performed constantly or intermittently or at scheduled timings.

The timing of monitoring can be selected according to its purpose. For example, if an endpoint of cleaning needs to be determined, the monitoring may effectively be performed during cleaning. If a frequency of cleaning needs to be determined, the monitoring may effectively be performed at an end of curing. If a timing of replacing the transmission glass window needs to be determined, the monitoring may effectively be performed at an end of cleaning or at a start of curing. However, as shown in FIG. 3, the illuminance at the end of cleaning and the illuminance at the start of curing are slightly different. Thus, depending on the timing of monitoring, different reference values which is used to determine which course of action should be taken are used. Also, it is effective to perform monitoring at a same timing in a cycle for different loads so as to enable to appropriately evaluate the degradation of the transmission glass window over time. The UV light can be emitted specifically for checking an illuminance or transmissivity when no curing or no cleaning takes place. Alternatively, the UV light used for curing or cleaning can also be used for checking an illuminance or transmissivity.

In FIG. 6, in step SI, a UV irradiation management process begins, and UV light are passed through a transmission glass window and illuminances upstream of the glass window and downstream of the glass window are monitored. In step S2, the illuminance downstream of the transmission glass window is compared with a first reference value, and if the illuminance downstream of the transmission glass window is equal to or lower than the first reference value, step S3 begins. If the illuminance downstream of the transmission glass window is not equal to or lower than the first reference value, this means that the transmission glass window maintains good transmissivity, and thus a next cycle (loading a next substrate into the chamber for curing without cleaning) begins in step S5. The first reference value can be pre-selected. In step S3, the illuminance upstream of the transmission glass window is compared with a second reference value, and if the illuminance upstream of the transmission glass window is not equal to or lower than the second reference value, cleaning of the transmission glass window begins in step S6. If the illuminance upstream of the transmission glass window is equal to or lower than the second reference value, this means that a reduction of the illuminance downstream of the transmission glass window is due to degradation of a UV lamp, rather than film formation on the surface of the transmission glass window, and thus, the UV lamp is replaced in step S4. The second reference may be pre-selected in view of the above.

In step S7, after the cleaning is initiated in step S6 and the passing UV light step and the monitoring step are repeated during the cleaning, the illuminance downstream of the transmission glass window monitored is compared with a third reference value. If the illuminance downstream of the transmission glass window is equal to or higher than the third reference value, this means that the glass window is sufficiently cleaned, and thus, the cleaning of the transmission glass window ends in step S8. A next cycle (loading a next substrate into the chamber for curing) then begins in step S9. If the illuminance downstream of the transmission glass window is not equal to or higher than the third reference value, the illuminances consecutively monitored downstream of the transmission glass window are compared in step S10. If a difference between the consecutively monitored illuminances downstream of the transmission glass window is equal to or less than a standard value, this means that the glass window is cleaned but still does not regain good transmissivity, and thus the cleaning of the transmission glass window ends in step S11. If the difference between the consecutively monitored illuminances downstream of the transmission glass window is more than the standard value, the glass window can be cleaned more, and thus, the cleaning continues in step S6. The third reference and the standard value may be pre-selected in view of the above.

When the glass window cannot further be cleaned in step S11, the output of the UV light increases to compensate for a differenced between the illuminance downstream of the transmission glass window at the end of the cleaning and the third reference value in step S12. In step S13, the illuminance downstream of the transmission glass window upon the increase of the output of the UV lamp is compared with a fourth reference value. If the illuminance downstream of the transmission glass window upon the increase of the output of the UV lamp is equal to or lower than a standard value, this means that the transmission glass window is degraded to the extend that the cleaning and the increase of the output of the UV light do not compensate for the degradation, and thus, the transmission glass window is replaced in step S14. If the illuminance downstream of the transmission glass window upon the increase of the output of the UV lamp is not equal to or lower than a standard value, a next cycle (loading a next substrate into the chamber for curing) then begins in step S 15. The fourth reference may be pre-selected in view of the above.

In the above, the passing UV light step and the monitoring step may be repeated after a different semiconductor substrate is loaded in the chamber, and at least one of the reference values can be selected based on the results of the previous monitoring. In the above, illuminance is used for managing UV irradiation. However, transmissivity or absorbance can also be used for the same purpose.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for managing UV irradiation for curing a semiconductor substrate, comprising:

passing UV light through a transmission glass window provided in a chamber for curing a semiconductor substrate placed in the chamber;

monitoring an illuminance upstream of the transmission glass window and an illuminance downstream of the transmission glass window to monitor UV light transmissivity of the transmission glass window; and determining a timing and/or duration of cleaning of the transmission glass window, a timing of replacing the transmission glass window, a timing of replacing a UV lamp, and/or an output of the UV light based on the monitored UV light transmissivity of the transmission glass window.

2. The method according to claim 1, wherein the monitoring step comprises measuring the illuminance upstream of the transmission glass window by an illuminometer provided upstream of the transmission glass window and the illuminance downstream of the transmission glass window by an illuminometer provided downstream of the transmission glass window, thereby obtaining a transmissivity of the UV light.

3. The method according to claim 1, wherein the passing UV light step and the monitoring step are performed at least at one time selected from the group consisting of a start of curing of the semiconductor substrate, an end of curing of the semiconductor substrate, a start of cleaning of the transmission glass window, and an end of cleaning of the transmission glass window.

4. A method for managing UV irradiation for curing a semiconductor substrate, comprising:
   passing UV light through a transmission glass window provided in a chamber for curing a semiconductor substrate placed in the chamber;
   monitoring an illuminance upstream of the transmission glass window and an illuminance downstream of the transmission glass window; and
   determining a timing and/or duration of cleaning of the transmission glass window, a timing of replacing the transmission glass window, a timing of replacing a UV lamp, and/or an output of the UV light based on the monitored illuminances,
   wherein the passing UV light step and the monitoring step are performed at least at one time selected from the group consisting of a start of curing of the semiconductor substrate, an end of curing of the semiconductor substrate, a start of cleaning of the transmission glass window, and an end of cleaning of the transmission glass window,
   wherein the determining step comprises:
   comparing the illuminance downstream of the transmission glass window with a first reference value;
   comparing the illuminance upstream of the transmission glass window with a second reference value;
   determining to initiate cleaning of the transmission glass window if the illuminance downstream of the transmission glass window is equal to or lower than the first reference value and the illuminance upstream of the transmission glass window is not equal to or lower than the second reference value; and
   determining to replace the UV lamp if the illuminance upstream of the transmission glass window is equal to or lower than the second reference value.

5. The method according to claim 4, wherein when the cleaning is initiated, the passing UV light step and the monitoring step are repeated during the cleaning and the determining step further comprises:
   comparing the illuminance downstream of the transmission glass window monitored with a third reference value; and
   determining to end cleaning of the transmission glass window if the illuminance downstream of the transmission glass window is equal to or higher than the third reference value.

6. The method according to claim 5, wherein when the illuminance downstream of the transmission glass window is not equal to or higher than the third reference value, the determining step further comprises:
   comparing the illuminances consecutively monitored downstream of the transmission glass window; and
   determining to end cleaning of the transmission glass window if a difference between the consecutively monitored illuminances downstream of the transmission glass window is equal to or less than a standard value.

7. The method according to claim 6, wherein the determining step further comprises:
   determining to increase the output of the UV light to compensate for a differenced between the illuminance downstream of the transmission glass window at the end of the cleaning and the third reference value.

8. The method according to claim 7, wherein the determining step further comprises:
   comparing the illuminance downstream of the transmission glass window upon the increase of the output of the UV lamp with a fourth reference value; and
   determining to replace the transmission glass window if the illuminance downstream of the transmission glass window upon the increase of the output of the UV lamp is equal to or lower than a standard value.

9. The method according to claim 3, wherein the passing UV light step and the monitoring step are repeated after a different semiconductor substrate is loaded in the chamber.

10. The method according to claim 9, wherein the determining step comprises comparing the illuminances monitored downstream of the transmission glass window in the respective monitoring steps, thereby determining the timing of replacing the transmission glass window.

11. The method according to claim 9, wherein the determining step comprises comparing the illuminances monitored in the respective monitoring steps, thereby determining the timing of cleaning the transmission glass window.

12. The method according to claim 1, wherein the passing UV light step and the monitoring step are performed frequently or continuously during cleaning, thereby determining an endpoint of the cleaning.

13. The method according to claim 3, wherein the determining step comprises determining the output of the UV light, and the method further comprises increasing the output of the UV light based on the determined output of the UV light determined to maintain the illuminance of the UV light passing through the transmission glass window.

14. The method according to claim 1, wherein the determining step comprises determining the timing of cleaning by setting a threshold value of illuminance to initiate cleaning and comparing the monitored illuminance downstream of the transmission glass window with the threshold value of illuminance.

15. A method for managing UV irradiation for curing a semiconductor substrate, comprising:
   passing UV light through a transmission glass window provided in a chamber for curing a semiconductor substrate placed in the chamber;
   monitoring an illuminance upstream of the transmission glass window and an illuminance downstream of the transmission glass window; and
   determining a timing and/or duration of cleaning of the transmission glass window, a timing of replacing the transmission glass window, a timing of replacing a UV lamp, and/or an output of the UV light based on the monitored illuminances, wherein the determining step comprises determining the timing of replacing the transmission glass window by setting a threshold value of illuminance to replace the transmission glass window and comparing the monitored illuminance downstream of the transmission glass window with the threshold value of illuminance.

16. The method according to claim 1, wherein the UV light has a wavelength of 170 nm to 300 nm.

17. A method for curing a semiconductor substrate by UV light, comprising:
   (i) curing a semiconductor substrate placed in a chamber by passing UV light through a transmission glass window provided in the chamber, in an atmosphere of a gas selected from the group consisting of Ar, CO, $CO_2$, $C_2H_4$, $CH_4$, $H_2$, He, Kr, Ne, $N_2$, $O_2$, Xe, alcohol gases, and organic gases;
   (ii) cleaning the transmission glass window using a cleaning gas;
   (iii) monitoring an illuminance upstream of the transmission glass window and an illuminance downstream of the transmission glass window during step (i) and/or (ii), thereby determining a timing and/or duration of cleaning of the transmission glass window, a timing of replacing the transmission glass window, a timing of replacing a UV lamp, and/or an output of the UV light based on the monitored illuminances; and
   (iv) according to step (iii), controlling the timing and/or duration of step (ii), replacing the transmission glass window, replacing the UV lamp, and/or increasing the output of the UV light in step (i).

* * * * *

UNITED STATES PATENT AND TRADEMARK OFFICE
CERTIFICATE OF CORRECTION

PATENT NO. : 7,501,292 B2 Page 1 of 2
APPLICATION NO. : 11/780021
DATED : March 10, 2009
INVENTOR(S) : Matsushita et al.

It is certified that error appears in the above-identified patent and that said Letters Patent is hereby corrected as shown below:

On drawing sheet 4, FIG. 4, please add title:

-- changes in transmissivity of a UV transmission glass using UV light (@172nm) over time (the initial transmissivity = 100%) --

In column 11, line 40, please change "SI," to -- S1 --

In column 12, line 41, please change "S 15" to -- S15 --

Signed and Sealed this

Eleventh Day of August, 2009

David J. Kappos
*Director of the United States Patent and Trademark Office*